(12) United States Patent
Lu et al.

(10) Patent No.: US 10,636,735 B2
(45) Date of Patent: Apr. 28, 2020

(54) PACKAGE STRUCTURE AND THE METHOD TO FABRICATE THEREOF

(75) Inventors: Bau-Ru Lu, Changhua County (TW); Jeng-Jen Li, Taipei (TW); Kaipeng Chiang, Taoyuan County (TW)

(73) Assignee: CYNTEC CO., LTD., Hsinchu (TW)

(*) Notice: Subject to any disclaimer, the term of this patent is extended or adjusted under 35 U.S.C. 154(b) by 445 days.

(21) Appl. No.: 13/273,247

(22) Filed: Oct. 14, 2011

(65) Prior Publication Data
US 2013/0093069 A1  Apr. 18, 2013

(51) Int. Cl.
*H01L 23/498* (2006.01)
*H01L 23/13* (2006.01)
*H01L 23/495* (2006.01)
*H01L 25/16* (2006.01)
*H01L 23/00* (2006.01)

(52) U.S. Cl.
CPC ........ *H01L 23/49861* (2013.01); *H01L 23/13* (2013.01); *H01L 23/49833* (2013.01); *H01L 23/49524* (2013.01); *H01L 24/45* (2013.01); *H01L 24/48* (2013.01); *H01L 24/83* (2013.01); *H01L 25/16* (2013.01); *H01L 2224/2919* (2013.01); *H01L 2224/29339* (2013.01); *H01L 2224/32257* (2013.01); *H01L 2224/45144* (2013.01); *H01L 2224/48245* (2013.01); *H01L 2224/48247* (2013.01); *H01L 2224/83192* (2013.01); *H01L 2224/83411* (2013.01); *H01L 2224/83439* (2013.01); *H01L 2224/83447* (2013.01); *H01L 2224/83851* (2013.01); *H01L 2924/13055* (2013.01); *H01L 2924/13091* (2013.01)

(58) Field of Classification Search
CPC ......... H01L 23/49833; H01L 23/49861; H01L 23/49524; H01L 23/13; H01L 25/16; H01L 2224/83447; H01L 2224/83411; H01L 2224/83192; H01L 2224/32257; H01L 2224/29339; H01L 2224/83439; H01L 2224/83851; H01L 2224/45144; H01L 24/48; H01L 24/83; H01L 24/45; H01L 2924/13091; H01L 2924/1305; H01L 2924/2919; H01L 2924/48245; H01L 2924/48247
See application file for complete search history.

(56) References Cited

U.S. PATENT DOCUMENTS 4,888,449 A * 12/1989 Crane .................... H01L 23/057
  174/540
4,939,316 A *  7/1990 Mahulikar ............ H01L 23/057
  174/546

(Continued)

*Primary Examiner* — Vongsavanh Sengdara
(74) *Attorney, Agent, or Firm* — Litron Patent & Trademark Office; Min-Lee Teng

(57) ABSTRACT

The invention discloses a package structure made of the combination of a metallic substrate and a lead frame. In one embodiment, a recess is formed in the metallic substrate and a first conductive element having at least one first I/O terminal is bonded in the recess. A lead frame is formed on the metallic substrate and comprises a plurality of electrical connections to connect with said at least one first I/O terminal of the first conductive element. In another embodiment, another conductive element is disposed in the vacancy of the lead frame. The invention also discloses a method for manufacturing a package structure made of the combination of a metallic substrate and a lead frame.

12 Claims, 11 Drawing Sheets

(56) References Cited

U.S. PATENT DOCUMENTS

| | | | | |
|---|---|---|---|---|
| 5,343,076 | A * | 8/1994 | Katayama | H01L 23/057 257/717 |
| 5,438,478 | A * | 8/1995 | Kondo | H01L 23/4334 174/260 |
| 5,449,951 | A * | 9/1995 | Parthasarathi | H01L 23/10 257/677 |
| 5,486,720 | A * | 1/1996 | Kierse | H01L 23/4334 257/659 |
| 6,093,960 | A * | 7/2000 | Tao | H01L 23/4334 257/666 |
| 6,184,575 | B1 * | 2/2001 | Chillara | H01L 23/3121 257/692 |
| 6,737,750 | B1 * | 5/2004 | Hoffman | H01L 23/3128 257/777 |
| 7,245,007 | B1 * | 7/2007 | Foster | H01L 23/49527 257/666 |
| 8,338,923 | B1 * | 12/2012 | Hwu | H01L 25/0753 257/666 |
| 2003/0168720 | A1 * | 9/2003 | Kamada | B29C 45/14655 257/666 |
| 2004/0095063 | A1 * | 5/2004 | Murazaki | H01L 33/38 313/503 |
| 2005/0275081 | A1 * | 12/2005 | Chang | H01L 23/5389 257/690 |
| 2009/0001406 | A1 * | 1/2009 | Okimura | H01L 33/483 257/99 |
| 2009/0283880 | A1 * | 11/2009 | Feng | H01L 23/4334 257/675 |
| 2011/0133218 | A1 * | 6/2011 | Lee | H01L 33/54 257/88 |
| 2012/0056223 | A1 * | 3/2012 | Hsieh | H01L 24/24 257/98 |
| 2013/0037309 | A1 * | 2/2013 | Kim | H01L 21/6835 174/251 |

* cited by examiner

PACKAGE STRUCTURE AND THE METHOD TO FABRICATE THEREOF

BACKGROUND OF THE INVENTION

I. Field of the Invention

The present invention relates to a package structure, and in particularly to a package structure made of the combination of a metallic substrate and a lead frame.

II. Description of the Prior Art

Lead frame is a material for IC package and can be in variety of forms such as QFP, TSOP, SOT or SOJ. The molded semiconductor devices are constructed by assembling and interconnecting a semiconductor device to a lead frame. The structure is often molded with plastic material. A lead frame is made by a metal ribbon with a paddle (also known as a die paddle, die-attach tab, or island) for attaching a semiconductor device thereto and a plurality of leads arranged in a manner such that the leads do not overlap the paddle on which the semiconductor device is to be mounted.

Conventionally, lead frame is used for die bond of an IC chip. The process flow includes many stages which are wire bond, molding of IC chip, and the tests after trimming or forming. Various products can be made by integrating or packaging the lead frame with other devices such as inductors or capacitors. It's one of the main package processes in the industry due to its easiness, maturity and better reliability. However, such kind of conventional process has many disadvantages including: a. higher cost and more development works of molding devices; b. poor capability in area design which is only in the form of plane so that product size doesn't shrink; c. lacking of modular capability as it is only good for packaging a single device; d. poor performance in heat dissipation. Accordingly, the present invention proposes a package structure and its manufacturing method to overcome the above-mentioned disadvantages.

SUMMARY OF THE INVENTION

One objective of the present invention is to provide a package structure comprising: a recess is formed the metallic substrate; a first conductive element having at least one first I/O terminal is bonded in the recess; a lead frame is formed on the metallic substrate (e.g., down set); a second conductive element having at least one second I/O terminal on the lead frame; wherein the lead frame comprises a plurality of electrical connections to connect with said at least one first I/O terminal of the first conductive element and said at least one second I/O terminal of second conductive element. Because the substrate is metallic, it has better performance in heat dissipation and electrical conductance. Moreover, it doesn't need complex process because the metallic substrate and the lead frame are directly combined.

A first conductive element is encapsulated mainly in the metallic substrate, not molded with plastic material; and a second conductive element can be mounted on the lead frame by SMT. The first conductive element and the second conductive element can be active elements, such as IC chip, MOSFET, IGBT or diode, or passive elements, such as resistors, capacitors or inductors. The first conductive element and the second conductive element are directly electrically connected to the metallic substrate (or pin), so it doesn't need additional PCB in order to connect them. Also, dispensing or gluing is used to replace molding encapsulation for protection of the first conductive element. Therefore, it does not need additional development of molding devices; it can save time and cost; and it's easier for design. Compared with lead frame and molding in conventional structure of IC package, the structure can make the shortest electrical path for connecting the components so that it can reduce total impedance and increase electrical efficiency.

Another objective of the present invention is to provide a package structure comprising: a metallic substrate having a recess which is formed on the metallic substrate; a first conductive element having at least one first I/O terminal which is bonded in the recess; a lead frame which is formed on the metallic substrate (e.g., down set); a second recess in the lead frame; a second conductive element having at least one second I/O terminal in the second recess; a third conductive element having at least one third I/O terminal on the lead frame; wherein the lead frame comprises a plurality of first electrical connections to connect with said at least one first I/O terminal of the first conductive element and said at least one second I/O terminal of second conductive element; wherein the metallic substrate comprises a plurality of second electrical connections to connect with said at least one third I/O terminal of the third conductive element.

In one embodiment of the present invention is to use both top surface and bottom surface of metallic substrate to make another package structure.

Another objective of the present invention is to provide a method for manufacturing a package structure: providing a metallic substrate; forming a recess in the metallic substrate; placing a conductive element having at least one I/O terminal in the first recess; and forming a lead frame on the metallic substrate, wherein the lead frame comprises a plurality of electrical connections to connect with said at least one I/O terminal of the conductive element.

In one embodiment of the present invention is to provide a method for manufacturing a package structure: providing a metallic substrate; forming a recess in the metallic substrate; placing a first conductive element having at least one first I/O terminal in the recess; forming a second conductive element having at least one second I/O terminal on the metallic substrate; and forming a lead frame over the second conductive element, wherein the lead frame comprises a plurality of first electrical connections to connect with said at least one first I/O terminal of the first conductive element and the metallic substrate comprises a plurality of second electrical connections to connect with said at least one second I/O terminal of the second conductive element.

The detailed technology and above preferred embodiments implemented for the present invention are described in the following paragraphs accompanying the appended drawings for people skilled in this field to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF THE INVENTION

The detailed explanation of the present invention is described as following. The described preferred embodiments are presented for purposes of illustrations and description, and they are not intended to limit the scope of the present invention.

Figure 1A:
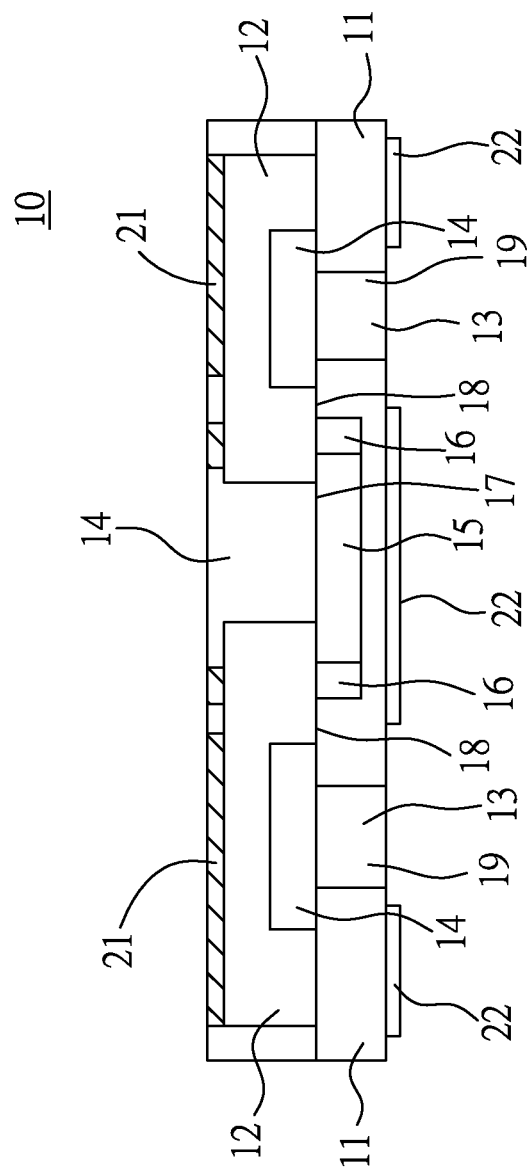
FIG. 1A illustrates a schematic cross-sectional view of the package structure.

The invention discloses a package structure made of the combination of a metallic substrate and a lead frame. FIG. 1A illustrates a cross-sectional view of the package structure 10. The structure 10 includes a metallic substrate 11, a lead frame 12, a filling layer 13, an insulating layer 14 and a first conductive element 15.

A metallic substrate 11 has a plurality of pins (not shown) as I/O terminals, and a plurality of pads 22 are placed underlying the pins for external electrical connection. The metallic substrate 11 can be a metallic frame with at least one vacancy 19. It's formed by removing one or more portions of the metallic substrate 11. The metallic substrate 11 can also be a lead frame or any other equivalent structure. The metallic substrate 11 can be made of at least one of Cu, Ag or Sn. In one embodiment, the metallic substrate 11 can have no vacancy or at least one vacancy. The vacancy 19 can be filled with any suitable filling layer 13, such as a gluing layer. Appearance or shape of the metallic substrate 11 depends on layout of pads 22 via which the pins of the metallic substrate is electrically connected to a PCB or another conductive element (not shown), such as IC chip, MOSFET, IGBT, diode, resistor, choke or capacitor.

A recess 16 is formed in the metallic substrate 11, and a conductive element 15 (e.g., IC chip, MOSFET, IGBT, diode, resistor, choke or capacitor) is bonded in the recess 16 by conventional techniques (e.g., Ag gluing). There are many different ways to locate the recess 16, for example, in one embodiment the recess 16 is formed inside of the metallic substrate 11; in another embodiment, the recess 16 is formed with one side aligned with one edge of the metallic substrate 11; and in yet another embodiment the recess 16 is formed with two sides aligned with two edges of the metallic substrate 11 respectively. In one embodiment, the recess 16 can be formed in the metallic substrate 11 which comprises a plurality of sub metallic substrates, wherein a plurality of sub metallic substrates are joined together. In one embodiment, at least one first conductive element 15 is bonded in the recess 16. I/O terminals (not shown) of the first conductive element 15 can be electrically connected to the lead frame 12 by conventional technology, such as wire bond, gold-ball bond, conductive wires or a combination thereof. In one embodiment, the top surface 17 of the first conductive element 15 and the top surface 18 of metallic frame are at the same horizontal level.

A lead frame 12 is formed on the metallic substrate 11 (e.g., down set). The lead frame 12 comprises a plurality of electrical connections to connect with a plurality of pins and I/O terminals of the first conductive element 15. In one embodiment, at least one lead frame 12 is disposed on the metallic substrate 11 to make better performance of electrical connections. The lead frame 12 has at least one vacancy (not shown). An insulating layer 14 is formed on the lead frame 12 and filled in the vacancy of the lead frame 12. In one embodiment, the filling layer 13 and the insulating layer 14 can be the same layer.

Figure 1B:
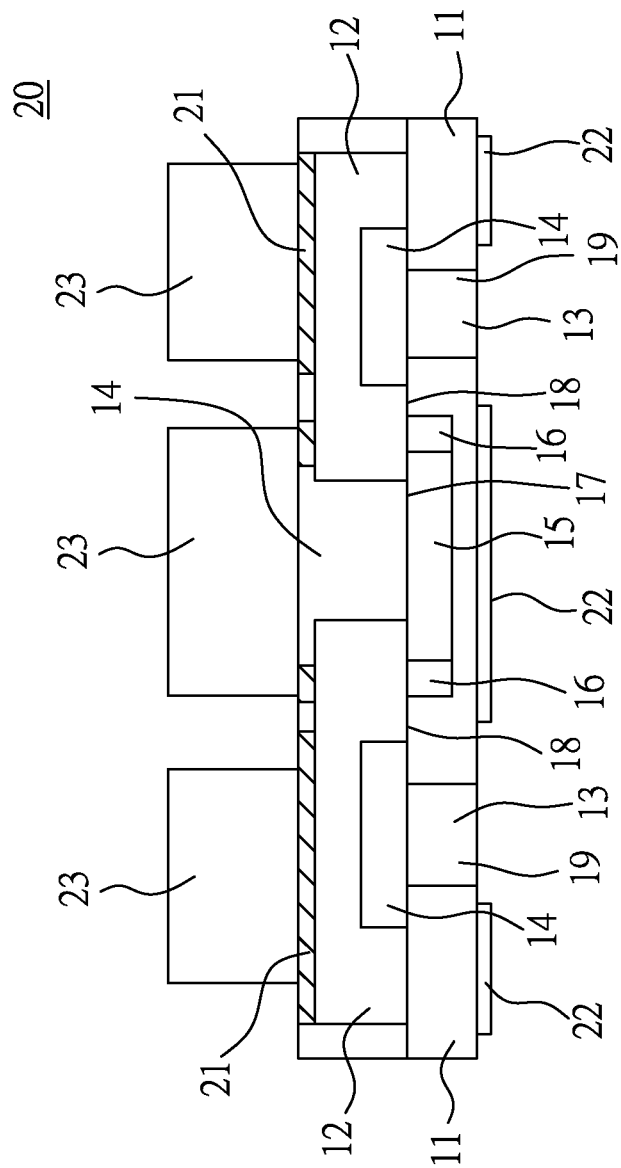
FIG. 1B illustrates a product structure with a conductive element on the structure in FIG. 1A.

FIG. 1B illustrates a product structure 20 having a second conductive element 23 on the structure 10 as shown in FIG. 1A. The product structure 20 further includes a second conductive element 23 compared with the structure 10. A plurality of first pads 21 can be formed on the lead frame 12 by conventional technology, such as film process, printing process or a combination thereof, so that the second conductive element 20 (e.g., IC chip, MOSFET, IGBT, diode, resistor, choke or capacitor) can be placed on the first pads 21. In one embodiment, at least one conductive layer (not shown) can be laid between the first pads 21 and the lead frame 12 to make better performance of electrical connection. A plurality of second pads 22 are placed underlying metallic substrate 11 (or pins) for external electrical connection. The second pad 22 can be made of any conductive material, such as Sn, Ni/Au or the like. The structure 20 can be mounted on a PCB or electrically connected to another conductive element (not shown) (e.g., IC chip, MOSFET, IGBT, diode, resistor, choke or capacitor) so that the second conductive element 23 can be electrically connected to the PCB or another conductive element (not shown) via the conductive path including the first pad 21, the lead frame 12, the metallic substrate (or pin) 11 and the second pad 22. It should be noted that the way to make electrical connections varies with different kinds of products or process performed on the metallic substrate. It can include many ways and is not limited to the ways described above. It can be readily appreciated by those skilled in the art and thus will not be further described herein.

Figure 1C:
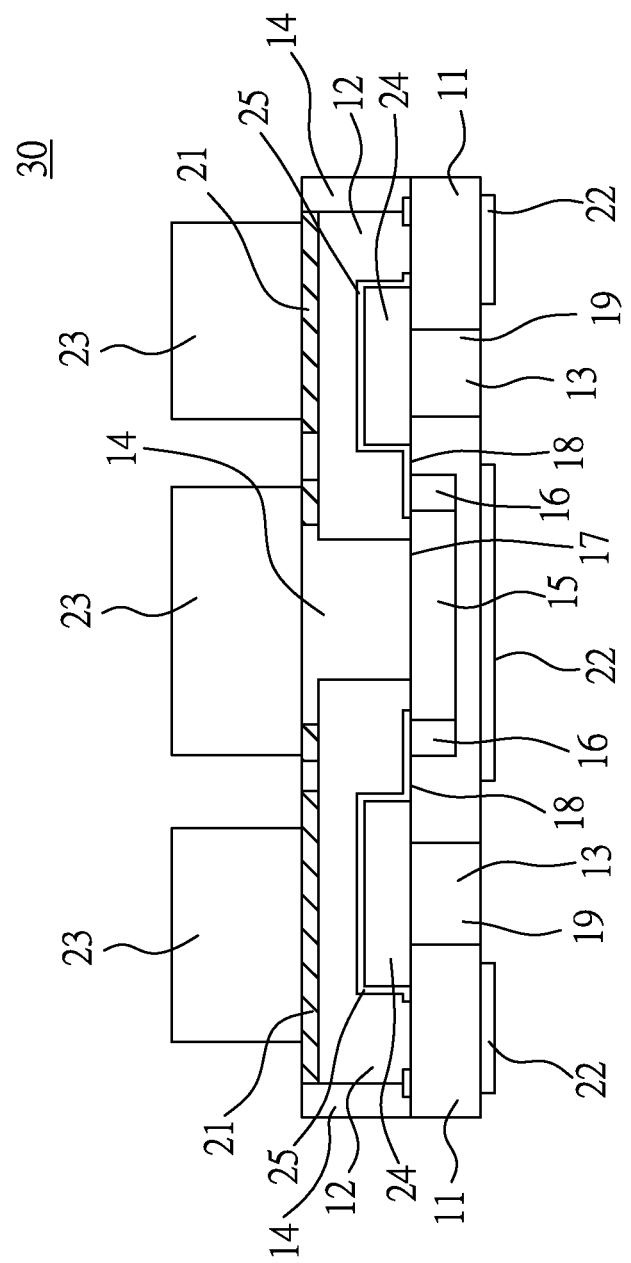
FIG. 1C illustrates another product structure with a conductive element on the structure in FIG. 1A.
Figure 1D:
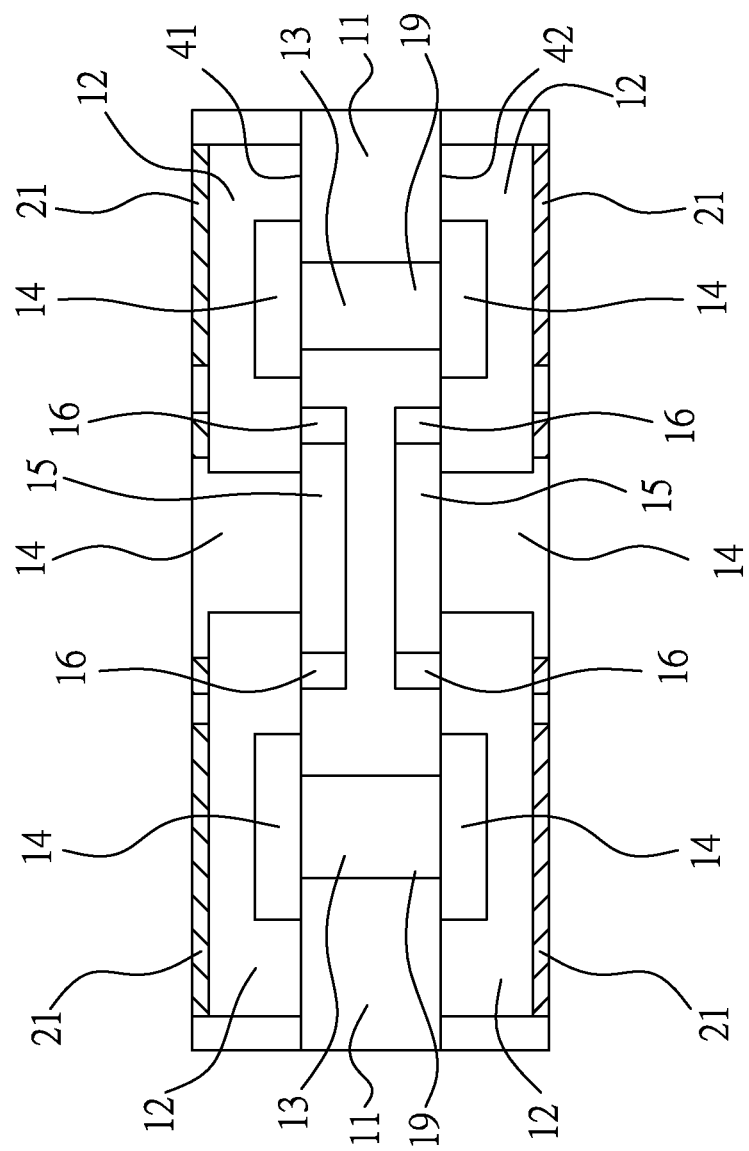
FIG. 1D illustrates a schematic cross-sectional view of another package structure.

In one embodiment, as illustrated in FIG. 1C, a third conductive element 24 is disposed in the vacancy of the lead frame 12. The third conductive element 24 is isolated from the lead frame 12 by a thin insulating layer 25. In another embodiment, as illustrated in FIG. 1D, the lead frames 12 can be placed on both top surface 41 and bottom surface 42 of metallic substrate 11. The features described above can also be applied to both top surface 41 and bottom surface 42 of metallic substrate 11.

FIG. 2A to FIG. 2F illustrate a sectional view of process flow for manufacturing a package structure 20 in FIG. 1B.

Figure 2A:
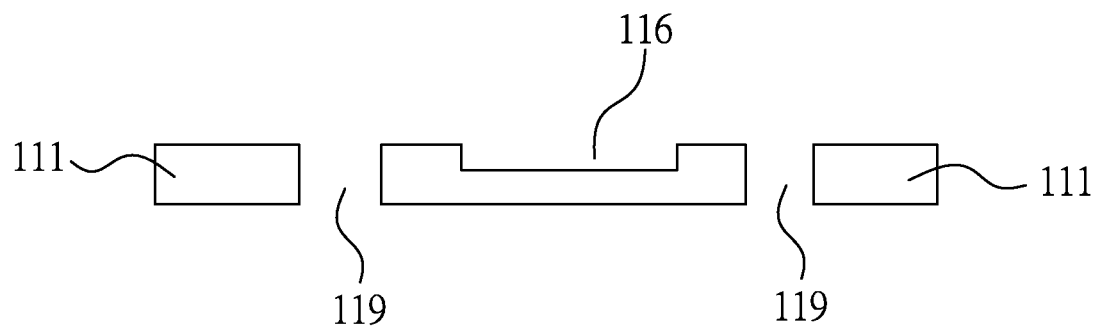
FIG. 2A to FIG. 2F illustrate a sectional view of process flow for manufacturing a package structure in FIG. 1B.
Figure 2B:
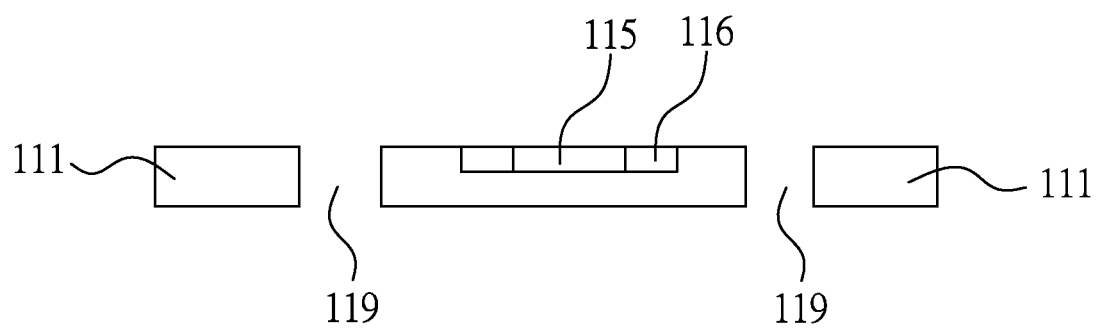
Figure 2C:
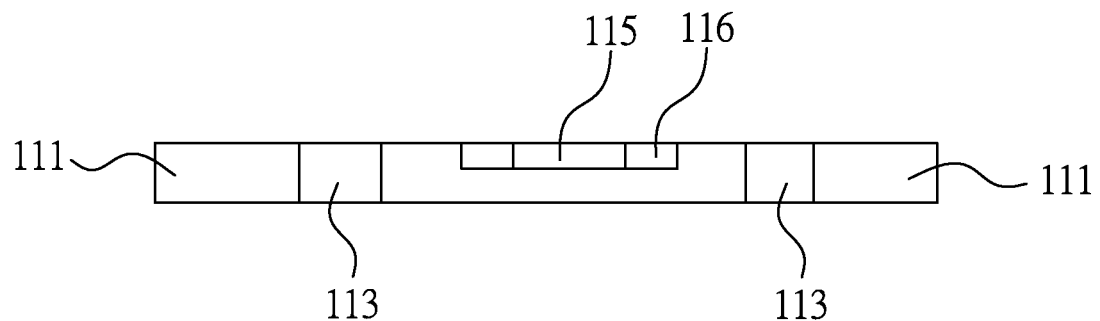
Figure 2D:
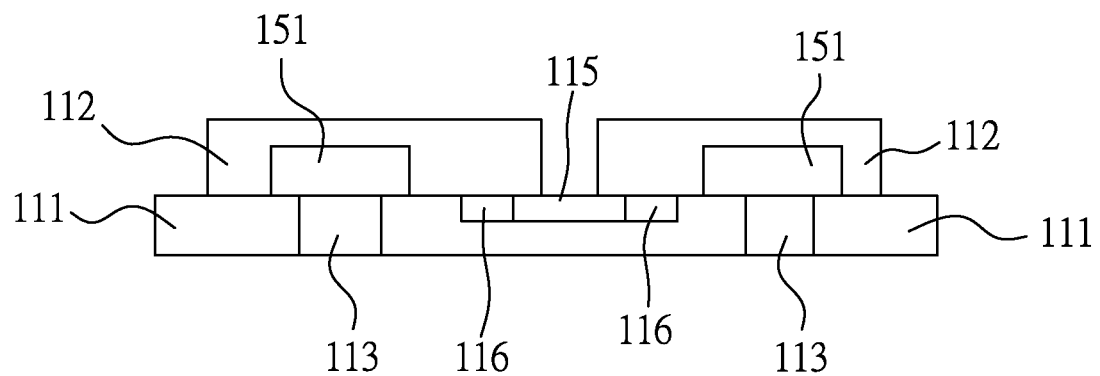
Figure 2E:
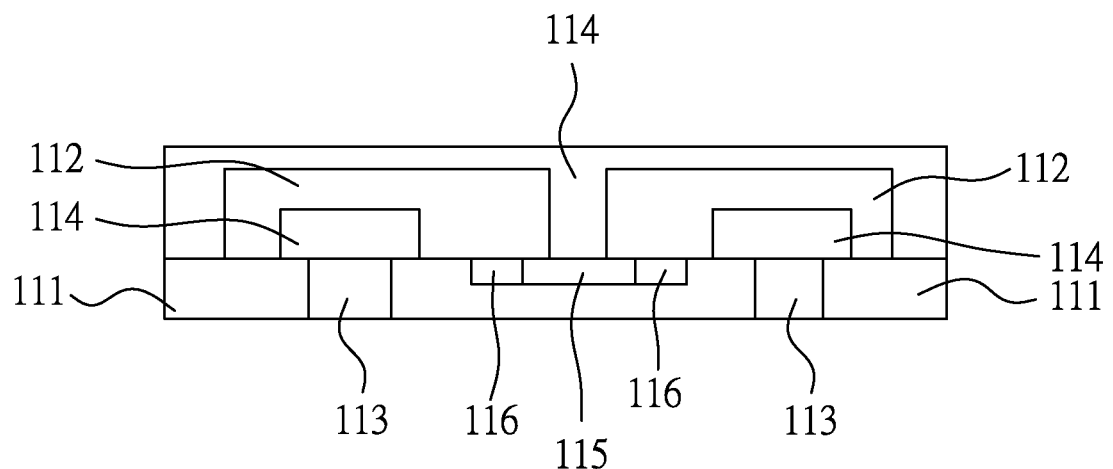
Figure 2F:
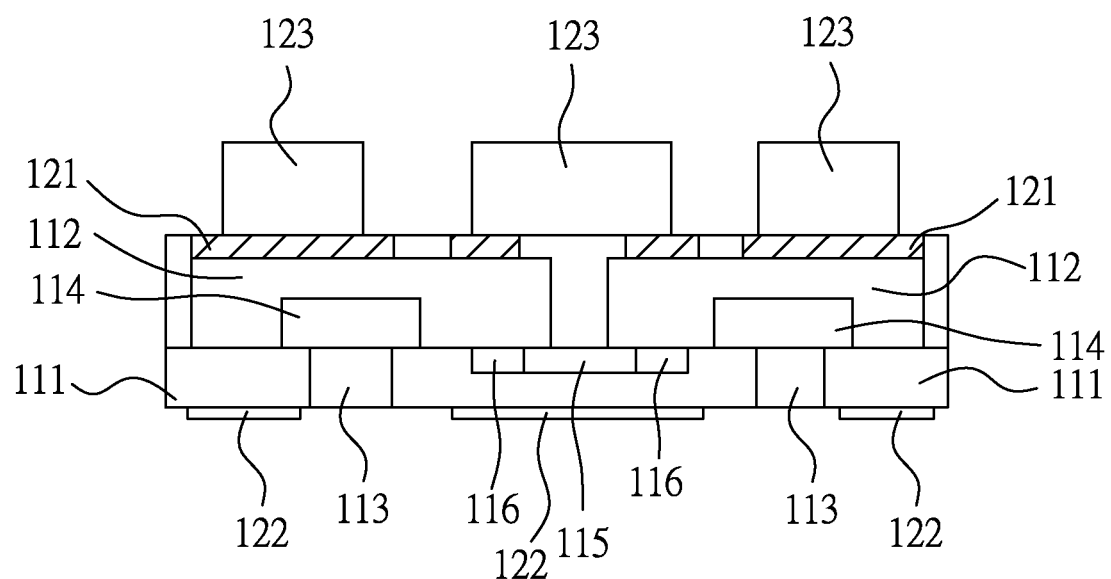

As illustrated in FIG. 2A, a metallic substrate 111 is provided. The metallic substrate 111 has at least one vacancy 119, and at least one recess 116 is formed in the metallic substrate 111. As illustrated in FIG. 2B, a first conductive element 115 having at least one first I/O terminal (not shown) is disposed in the recess 116. Then, the remaining portion of the recess 116 is filled with any suitable material. As illustrated in FIG. 2C, the vacancy 119 of the metallic substrate 111 is filled with a filling layer 113, such as a gluing layer. As illustrated in FIG. 2D, a lead frame 112 is formed on the metallic substrate 111 (e.g., down set). The lead frame 112 can be electrically connected to I/O terminals of the first conductive element 115 and a portion of the metallic substrate 111. The lead frame 112 has at least one vacancy 151. As illustrated in FIG. 2E, an insulating layer 114 is formed on the lead frame 112 and filled in the vacancy 151 of the lead frame 112. The insulating layer 114 can completely protect the lead frame 112. The height of the insulating layer 114 can exceed the height of the lead frame 112 so that the subsequent process, such as film process or printing process, can be applied on the insulating layer 114. In one embodiment, order of forming a lead frame 112 in FIG. 2D and forming an insulating layer 114 can be arbitrary. In one embodiment, the filling layer 113 and the insulating layer 114 can be the same or formed in single process step. Then, as illustrated in FIG. 2F, openings (not shown) in the insulating layer 114 are formed to place a plurality of first pads 121, and at least one second conductive element 123 is disposed on the first pads 121. A plurality of second pads 122 are placed underlying the metallic substrate 111 (or pins) for external electrical connection which has been described above. The second conductive element 123 can be electrically connected to a PCB or another conductive element (not shown) via the conductive path including the first pad 121, the lead frame 112, the metallic substrate (or pin) 111 and a second pad 122.

FIG. 3A to FIG. 3F illustrate a sectional view of process flow for manufacturing another package structure 30 in FIG. 1C.

Figure 3A:
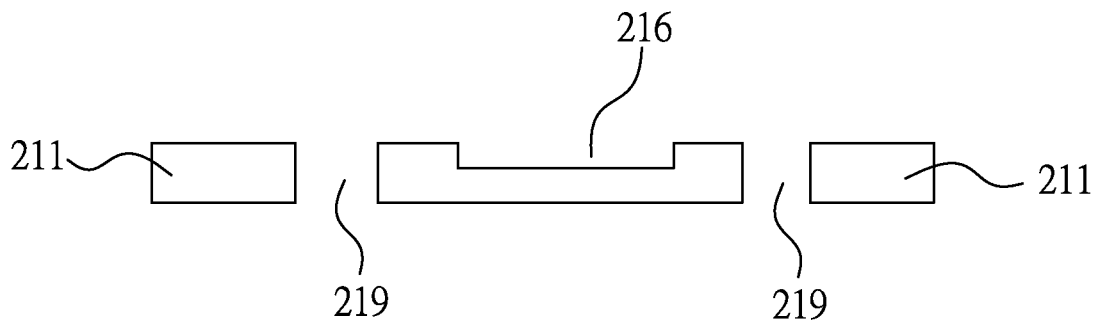
FIG. 3A to FIG. 3H illustrate a sectional view of process flow for manufacturing another package structure in FIG. 1C.
Figure 3B:
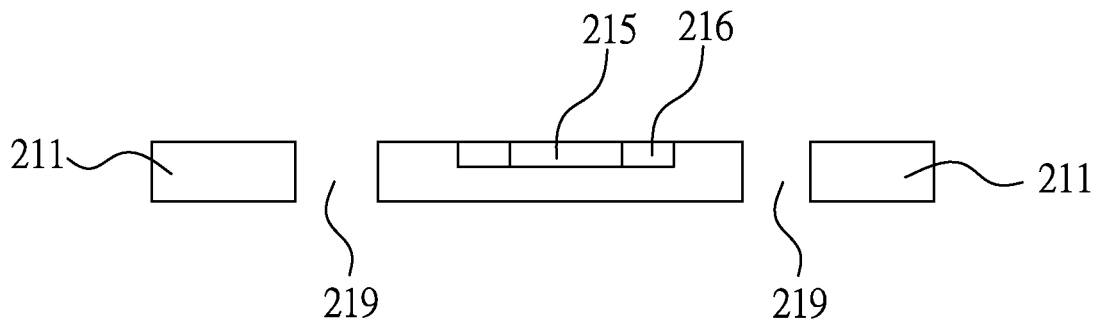
Figure 3C:
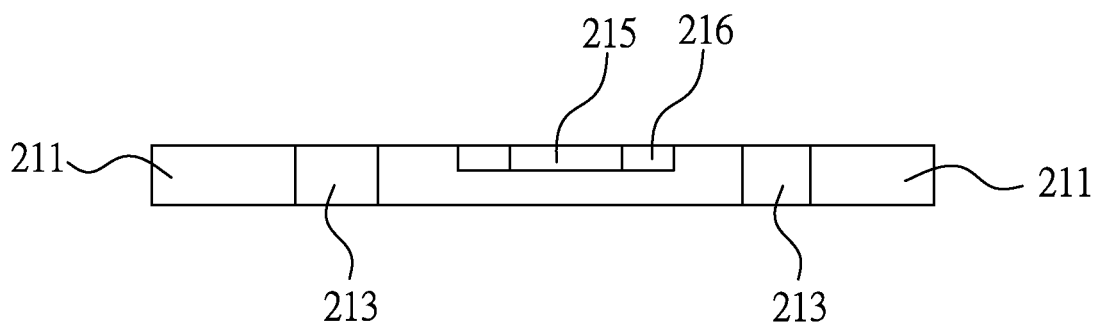
Figure 3D:
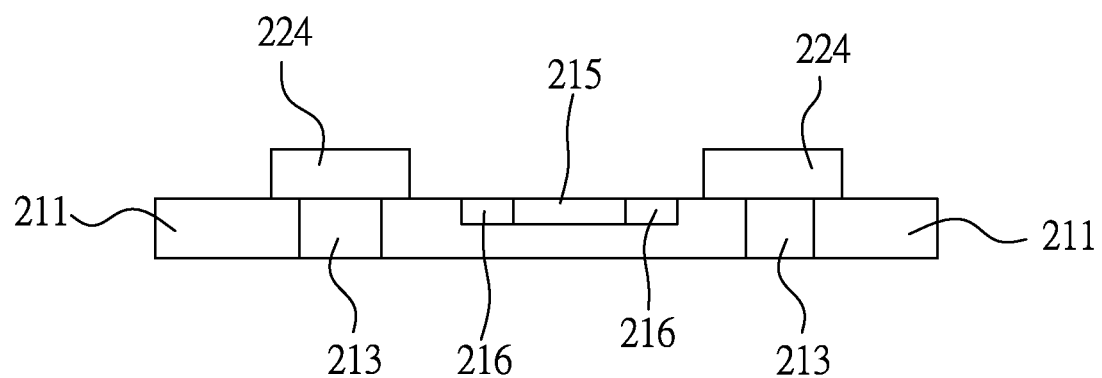
Figure 3E:
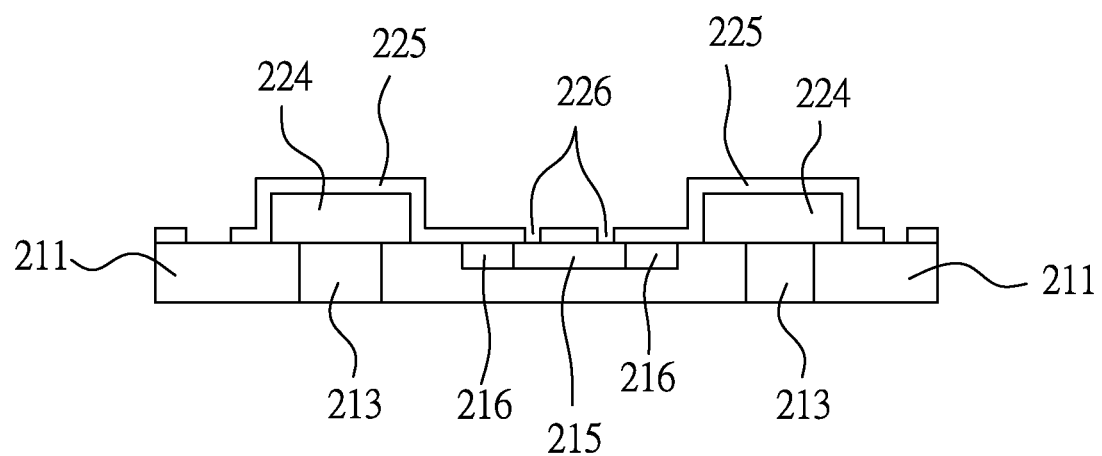
Figure 3F:
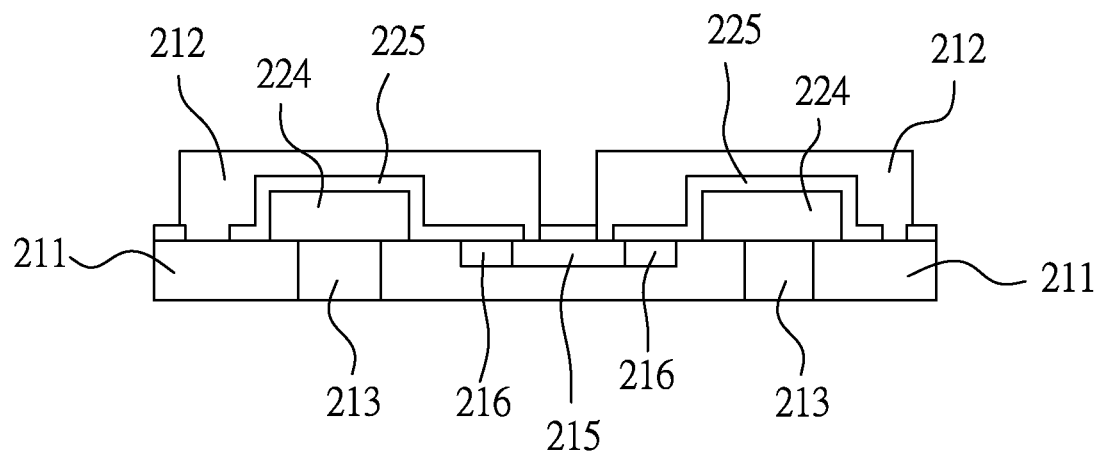
Figure 3G:
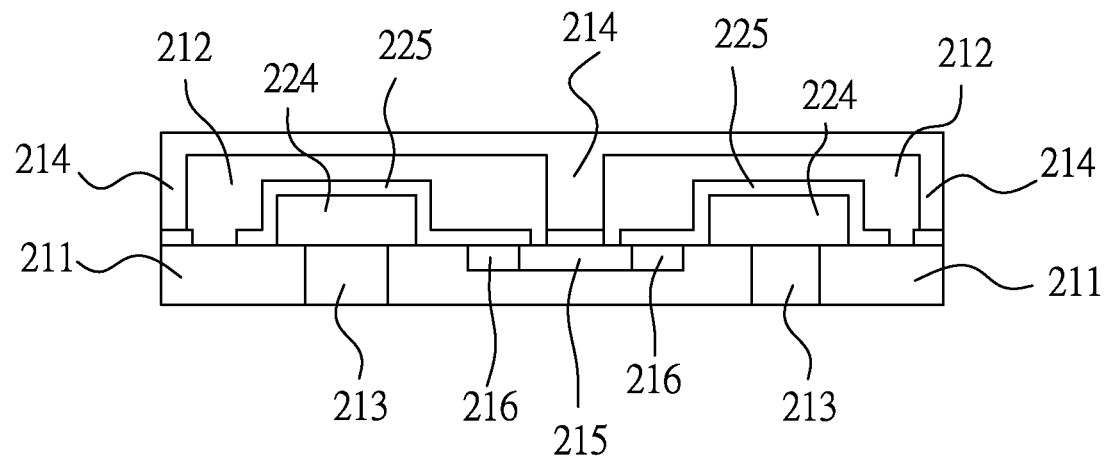
Figure 3H:
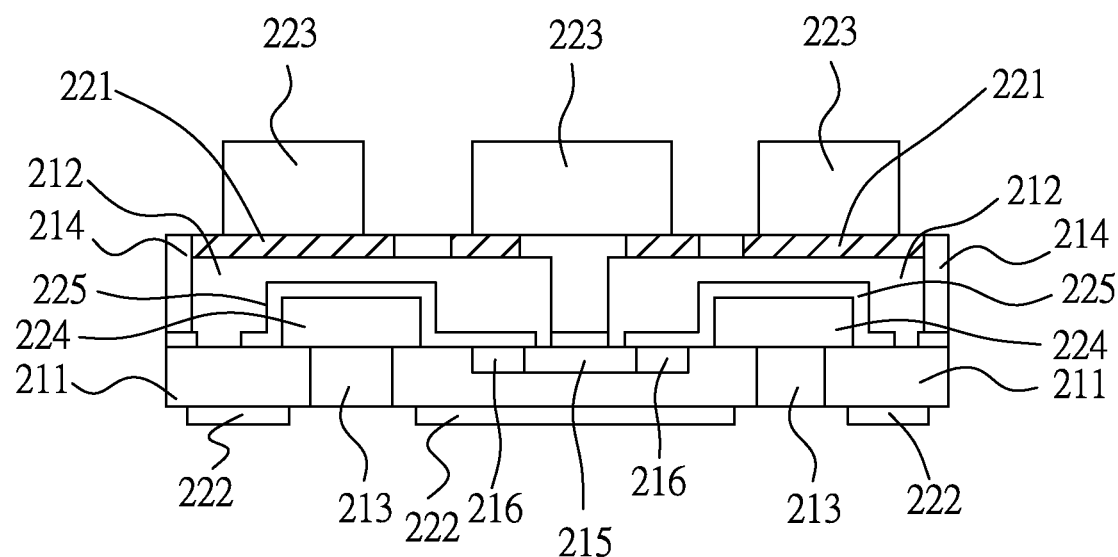

As illustrated in FIG. 3A, a metallic substrate 211 is provided. The metallic substrate 211 has at least one vacancy 219, and a least one recess 216 is formed in the metallic substrate 211. As illustrated in FIG. 3B, a first conductive element 215 having at least one first I/O terminal (not shown) is disposed in the recess 216. Then, the remaining portion of the recess 216 is filled with any suitable material. As illustrated in FIG. 3C, the vacancy 219 of the metallic substrate is filled with a filling layer 213, such as a gluing layer. As illustrated in FIG. 3D, a second conductive element 224 is formed on the metallic substrate 211. As illustrated in FIG. 2E, a thin insulating layer 225 is deposited over the second conductive element 224 in order to isolate the second conductive element 224 from the lead frame 212, which will be described hereafter. The second conductive element 224 is electrically connected to the metallic substrate 211 to improve electrical performance. The second conductive element 224 can be an active element or a passive element, such as MOSFET, IGBT, diode, resistor, choke or capacitor. In a preferred example, the second conductive element 224 is a resistor. Then, openings 226 in the thin insulating layer 225 are formed to expose I/O terminals of first conductive element 215 and a portion of the metallic substrate 211. As illustrated in FIG. 3F, a lead frame 212 is formed (e.g., down set) over the second conductive element 224 so that the lead frame 212 can be electrically connected to I/O terminals of the first conductive element 215 and a portion of the metallic substrate 211 through the openings 226. As illustrated in FIG. 3G, a thick insulating layer 214 is formed over the second conductive element 224 and on a portion of the thin insulating layer 225. The insulating layer 214 can completely protect the lead frame 212. The height of the insulating layer 214 can exceed the height of the lead frame 212 so that the subsequent process can be applied on the insulating layer 214, such as film process or printing process. In one embodiment, the filling layer 213 and the insulating layer 214 can be the same or formed in single process step. Then, as illustrated in FIG. 3H, openings (not shown) are formed in the insulating layer 214 to place a plurality of first pads 21, and a third conductive element 223 is disposed on the first pads 221. A plurality of second pads 222 are placed underlying the metallic substrate 211 (or pins) for external electrical connection which has been described above. The third conductive element 223 can be electrically connected to a PCB or another conductive element (not shown) via the conductive path including the first pad 221, the lead frame 212, the metallic substrate (or pin) 211 and the second pad 222.

It follows from description of the above embodiments that the structure in the present invention and the method for manufacturing the same can offer many advantages including: 1. Better performance of heat dissipation because of metallic substrate; 2. saving time and cost without using embedded resin, which does not need additional development of molding devices; 3. simpler process because the metallic substrate and the lead frame are directed combined. 4. better electrical performance compared with lead frame and molding in conventional structure of IC package, because the structure can make the shortest electrical path for connecting the components so that it can reduce total impedance and increase electrical efficiency.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A package structure, comprising:
 a metallic substrate comprising a metal body and a plurality of pins, wherein a filling layer made of insulating material is disposed between each of the plurality of pins and the metal body to isolate the pin from the metal body;
 a recess in the metal body, wherein a bottom surface of the recess comprises a contiguous metal path from a first side wall of the recess to a second side wall opposite to the first side wall of the recess, wherein the metallic substrate has a top surface outside the recess;
 a first electronic device having a first I/O terminal disposed on a top surface of the first electronic device, wherein the first electronic device is disposed in the recess;
 a first lead frame, comprising a first portion disposed directly above said top surface of the metallic substrate and a second portion disposed directly above said top surface of the first electronic device for electrically connecting said first I/O terminal of the first electronic device to a first pin of the plurality of pins, wherein a bottom surface of said first pin that is located below the bottom surface of the recess extends upright to a portion of a top surface of said first pin that is in contact with and electrically connected to the first lead frame, wherein a plurality of pads are disposed on a top surface of the first lead frame; and
 a second electronic device, disposed over the top surface of the first lead frame and electrically connected to corresponding pads of the plurality of pads.

2. The package structure according to claim 1, further comprising: a vacancy in the first lead frame; and a third electronic device disposed in the vacancy, wherein the metallic substrate comprises a plurality of electrical connections to connect with said third electronic device.

3. The package structure according to claim 1, wherein the second electronic device comprises at least one of IC chip, MOSFET, IGBT, diode, choke, capacitor or resistor.

4. The package structure according to claim 1, further comprising a second lead frame, wherein the first lead frame and second lead frame are on two opposite surfaces of the metallic substrate.

5. The package structure according to claim 1, wherein the metallic substrate is made of at least one of Cu, Ag or Sn.

6. The package structure according to claim 1, wherein the first electronic device comprises at least one of IC chip, MOSFET, IGBT, diode, choke, capacitor or resistor.

7. The package structure according to claim 1, wherein the metallic substrate is made of a plurality of sub metallic substrates.

8. The package structure according to claim 1, wherein the first lead frame is made of a plurality of sub lead frames.

9. The package structure according to claim 1, further comprising a conductive layer on the first lead frame.

10. A package structure, comprising:
- a metallic substrate comprising a metal body and a plurality of pins, wherein a first filling layer made of insulating material is disposed between each of the plurality of pins and the metal body to isolate the pin from the metal body;
- a recess in the metal body, wherein a bottom surface of the recess comprises a contiguous metal path from a first side wall of the recess to a second side wall opposite to the first side wall of the recess, wherein the metallic substrate has a top surface outside the recess;
- a first electronic device having a first I/O terminal disposed on a top surface of the first electronic device, wherein the first electronic device is disposed in the recess;
- a second insulating layer disposed on said top surface of the first electronic device and said top surface of metallic substrate;
- a first lead frame disposed on the second insulating layer, wherein the first lead frame comprises a first portion disposed directly above said top surface of the metallic substrate and a second portion disposed directly above said top surface of the first electronic device for electrically connecting said first I/O terminal of the first electronic device to a first pin of the plurality of pins, wherein a bottom surface of said first pin that is located below the bottom surface of the recess extends upright to a portion of a top surface of said first pin that is in contact with and electrically connected to the first lead frame, wherein a plurality of pads are disposed on a top surface of the first lead frame; and
- a second electronic device, disposed over the top surface of the first lead frame and electrically connected to corresponding pads of the plurality of pads.

11. The package structure according to claim 10, wherein the top surface of the electronic device and the top surface of the metallic substrate are substantially at the same horizontal level.

12. A package structure, comprising:
- a metallic substrate comprising a metal body and a plurality of pins;
- a recess in the metal body, wherein a bottom surface of the recess comprises a contiguous metal path from a first side wall of the recess to a second side wall opposite to the first side wall of the recess, wherein the metallic substrate has a top surface outside the recess;
- a first electronic device having a first I/O terminal disposed on a top surface of the first electronic device, wherein the first electronic device is disposed in the recess;
- a first lead frame, comprising a first portion disposed directly above said top surface of the metallic substrate and a second portion disposed directly above said top surface of the first electronic device for electrically connecting said first I/O terminal of the first electronic device to a first pin of the plurality of pins, wherein a bottom surface of said first pin that is located below the bottom surface of the recess extends upright to a portion of a top surface of said first pin that is in contact with and electrically connected to the first lead frame, wherein a plurality of pads are disposed on a top surface of the first lead frame; and
- a second electronic device, disposed over the top surface of the first lead frame and electrically connected to corresponding pads of the plurality of pads.

* * * * *